United States Patent [19]
Williamson

[11] Patent Number: 4,953,960
[45] Date of Patent: Sep. 4, 1990

[54] OPTICAL REDUCTION SYSTEM

[76] Inventor: David M. Williamson, 26 Chimney Dr., Bethel, Conn. 06801

[21] Appl. No.: 223,968

[22] Filed: Jul. 15, 1988

[51] Int. Cl.$^5$ .............................................. G02B 17/00
[52] U.S. Cl. .................................. 350/442; 350/444; 350/445
[58] Field of Search ............... 350/442, 443, 444, 445, 350/446

[56] References Cited

U.S. PATENT DOCUMENTS

| | | | |
|---|---|---|---|
| 2,801,570 | 8/1957 | Nomarski et al. | 350/442 |
| 3,256,766 | 6/1966 | Allesson | 350/442 X |
| 3,536,380 | 10/1970 | Farguson | 350/442 |
| 4,108,539 | 8/1978 | Gort et al. | 350/444 |

Primary Examiner—Scott J. Sugarman
Attorney, Agent, or Firm—Thomas P. Murphy; Edwin T. Grimes

[57] ABSTRACT

An unobscured catadioptric optical reduction system wherein all refractive elements are made of the same material. From its long conjugate end to its short conjugate end the system comprises a first lens group, a beamsplitter, a second lens group, a mirror and a third lens group arranged so that radiation entering the system at its long conjugate end passes through the first lens group, the beamsplitter, the second lens group, and is reflected by the mirror back through the second lens group and is reflected by the beamsplitter through the third lens group. Aberrations of the mirror are corrected by the refractive elements. Lateral color correction is obtained by balancing the power of the first lens group against the power of the third lens group.

15 Claims, 1 Drawing Sheet

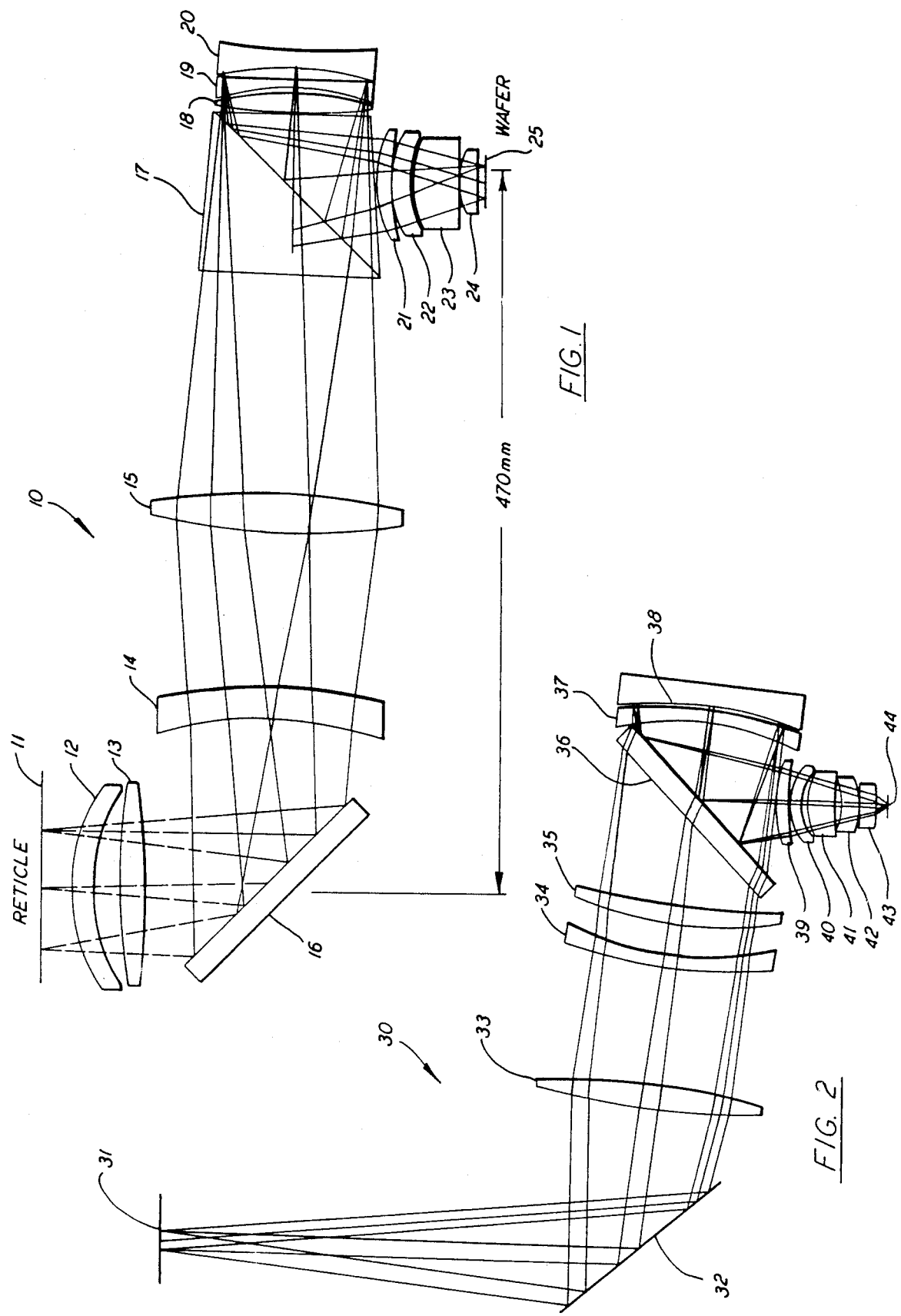

OPTICAL REDUCTION SYSTEM

BACKGROUND OF THE INVENTION

The design of semiconductor manufacturing equipment is driven by the trend toward higher density integrated circuits. In an optical projection system decrease in feature size theoretically is limited only by the capability of the system to function at short wavelengths, i.e., the further into the U.V. region of the spectrum the projection light source extends, the smaller will be the feature size. In practice, however, feature size is limited by the resolution capabilities of the optical system, i.e., the capability of the optical system to transmit the object as an image substantially free of aberrations introduced by the optics. The problem of maintaining high resolution, i.e., an optical system substantially free of aberrations is exacerbated further where the projection system is designed to include the added advantage of reduction, i.e., reduction of the size of the object when it is imaged.

BRIEF DESCRIPTION OF THE INVENTION

The present invention is a major advance in optical projection systems and is capable of functioning in the deep U.V. with feature resolution capabilities of less than 0.35 microns. The present invention has the added important advantage of being compact, i.e., less than half a meter in length while incorporating a 0.45 numerical aperture and covering a relatively large image field size.

The present invention is related to the optical system disclosed by C. G. Wynne in U.S. Pat. No. 4,796,984 (ref: C. G. Wynne, Optical Instruments and Techniques, Oriel Press, New Castle upon Tyne, England (1969)), based on a system described by Dyson (ref: J. Dyson, "Unit Magnification Optical System Without Siedel Aberrations", J. Opt. Soc. Am. 49(7), 713–716 (1959). Its major difference lies in its operation at a reduction ratio other than 1:1.

In one embodiment of the present invention a catadioptric optical reduction system comprises from the long conjugate end to the short conjugate end a first lens group, a second lens group, a beamsplitter, a third lens group, a reduction mirror, and a fourth lens group. The system is arranged to have object and image planes parallel. The system is telecentric at both ends. All the refractive elements are made of the same material—fused silica. The beamsplitter is a cube, also of fused silica.

Low order coma and spherical aberration of the reduction mirror are corrected by the third lens group. Astigmatism to all orders is corrected predominately by the fourth group, the airspaces of which also give high order coma and distortion correction. Low order distortion is primarily corrected by choosing an optimum power ratio between the second and fourth groups.

Axial color (chromatic difference of focus) is balanced against the chromatic difference of field curvature. Lateral color (chromatic difference of magnification) of the second group is balanced against that of the fourth group.

In another embodiment the present invention is a catadioptric optical reduction system comprising from the long conjugate end a first lens group, a thin tilted beamsplitter, a second lens group, a spherical mirror and a third lens group. The system is arranged to have object and image planes parallel and is telecentric at the short conjugate end. All the refractive elements are made of the same material—fused silica. Low order coma, spherical aberration and distortion of the reduction mirror are corrected by the second lens group. Astigmatism to all orders is corrected predominately by the second and third groups. The airspaces of the third group give high order coma and distortion correction. Low order distortion of the first and third groups are balanced against each other.

Residual axial color is again balanced against the chromatic difference of field curvature. Lateral color of the first group is balanced against that of the third group.

The present invention has general utility in projection microlithography and is useful in step-and-repeat, step-and-scan or full field scanning systems.

BRIEF DESCRIPTION OF THE DRAWINGS

FIG. 1 is a schematic of a first embodiment of the optical system of the present invention; and FIG. 2 is a schematic of a second embodiment of the optical system of the present invention.

DESCRIPTION

FIG. 1 illustrates a version of the optical reduction system 10 of the present invention. From its long conjugate end it comprises object or reticle plane 11, a first lens group comprising shell 12 and positive lens 13, a second lens group comprising negative lens 14 and positive lens 15. A folding mirror 16 is disposed between the first and second lens group, i.e., between lens pair 12 and 13 and lens pair 14 and 15. As can be seen, folding mirror 16 changes the direction of radiation 90° and its purpose is to cause the object and image planes to be parallel as well as to shorten the overall length of the optical system. Next there is beamsplitter cube 17 followed by a third lens group comprising positive lens 18 and negative lens 19. This lens group arrangement is sometimes referred to as an air-spaced doublet. Next is the concave spherical mirror 20. Finally, a fourth lens group with overall positive power comprises positive lens 21, shell 22 which is slightly negative and positive lenses 23 and 24.

Radiation entering the system at the reticle or long conjugate end passes through the first group, i.e., lenses 12 and 13, is reflected by folding mirror 16 and passes through the second lens group, i.e., lenses 14 and 15, beamsplitter 17, the third lens group, i.e., lenses 18 and 19, is reflected by mirror 20 passes back through lens 18 and 19 and is reflected by beamsplitter 17 through the fourth lens group which comprises lenses 21, 22, 23, and 24 and is focussed at image or wafer plane 25.

Lenses 12 and 13 of the first lens group and lenses 21, 22, 23 and 24 of the fourth lens group provide telecentricity at the object and image planes 11 and 25, respectively.

As in the related Wynne-Dyson optical system, the field curvature and astigmatism of the spherical mirror 20 is balanced against the total power of the refracting elements. However, unlike the Wynne-Dyson system, mirror 20 is operating at a reduction ratio other than 1:1. It therefore introduces spherical aberration and coma—these are corrected predominately by the airspaced doublet (lenses 18, 19—the third group) with substantial assistance from the beamsplitter cube in the converging beam between the third and fourth groups. The other problem arising from a reduction ratio other than 1:1 is that distortion has to be corrected—this is achieved primarily by the optimum choice of power and location between the second and fourth groups, with some assistance from the first group and beamsplitter cube.

A problem with the original Dyson system is that there is negligible clearance between the last optical surface and the image plane. This is overcome in the Wynne system by the use of a second refracting material of different refractive index. In the present invention only one material is used and the airspaces in the fourth group (lenses 21-24) achieve the same goal. In addition, they provide higher order coma and distortion correction that again is required by the reduction ratio being other than 1:1.

Performance of the Wynne-Dyson system is limited by high order astigmatism. In the present invention this is substantially corrected by the first two groups, particularly the shell 2 and weak negative lens 14. The predominant low order astigmatism correction comes from the power of the fourth group.

As the majority of the reduction is provided by spherical mirror 20, chromatic aberrations are inherently small. Residual axial color (chromatic difference of focus) is not corrected, but rather balanced against chromatic variation of the field curvature, which limits the spectral bandwidth of the system to the range 240-256 nanometers. This is more than adequate for an Excimer laser source, and also allows the use of a filtered Mercury Arc. Over this range, Secondary Spectrum is negligible—a benefit of using only one refracting material. Lateral color (chromatic difference of magnification) is corrected by the balance of power between the second and fourth groups. Spherochromatism (chromatic variation of spherical aberration) is minimized by the third group.

The embodiment of FIG. 1 is designed to operate with a 0.45 numerical aperture at a 4 to 1 reduction ratio with a 30 mm diameter image field.

Table I is an example indicating the construction data of the optical system of FIG. 1, given with the system unfolded.

TABLE I

| No. | Radius | Sepn | Clr. Diam. | Material |
|---|---|---|---|---|
| 1 | 154.729 | 17.442 | 129.56 | FQTZ |
| 2 | 147.836 | 17.860 | 126.72 | Air |
| 3 | 642.694 | 17.442 | 128.36 | FQTZ |
| 4 | −939.006 | 240.837 | 129.45 | Air |
| 5 | −236.132 | 20.930 | 144.90 | FQTZ |
| 6 | −343.127 | 85.549 | 151.08 | Air |
| 7 | 694.200 | 25.116 | 167.11 | FQTZ |
| 8 | −370.976 | 175.727 | 167.37 | Air |
| 9 | Plane | 120.558 | 130.07 | FQTZ |
| 10 | Plane | 2.016 | 114.03 | Air |
| 11 | 540.410 | 13.953 | 113.03 | FQTZ |
| 12 | −299.296 | 4.842 | 111.86 | Air |
| 13 | −184.842 | 7.757 | 111.02 | FQTZ |
| 14 | 2217.512 | 8.155 | 110.46 | Air |
| 15 | −305.041 | −8.155 | 113.25 | Air |
| 16 | 2217.512 | −7.757 | 112.36 | FQTZ |
| 17 | −184.842 | −4.842 | 108.12 | Air |
| 18 | −299.296 | −13.953 | 107.99 | FQTZ |
| 19 | 540.410 | −2.016 | 106.87 | Air |
| 20 | Plane | −55.814 | 105.13 | FQTZ |
| 21 | Plane | 61.395 | 91.46 | FQTZ |
| 22 | Plane | 1.101 | 76.42 | Air |
| 23 | 90.557 | 11.163 | 73.13 | FQTZ |
| 24 | 184.450 | 2.016 | 114.03 | Air |
| 25 | 75.556 | 11.163 | 66.13 | FQTZ |
| 26 | 64.512 | 5.262 | 58.39 | Air |
| 27 | 113.909 | 32.289 | 57.23 | FQTZ |
| 28 | 813.059 | 1.116 | 40.67 | Air |

TABLE I-continued

| No. | Radius | Sepn | Clr. Diam. | Material |
|---|---|---|---|---|
| 29 | 211.059 | 6.455 | 39.12 | FQTZ |
| 30 | Plane | 5.581 | 35.64 | Air |
| 31 | Plane |  | 30.30 |  |

The embodiment of FIG. 2 shows a catadioptric optical reduction system 30. This embodiment is similar to that of FIG. 1 but differs in that the first lens group is eliminated and the beamsplitter cube is replaced by a thin tilted beamsplitter. Elimination of the first lens group does away with telecentricity at the object or reticle plane, which is not a necessity. Also, such removal of several refractive elements as well as use of a thin beamsplitter permits uses of the optical system of FIG. 2 deeper in the U.V. since absorption is lessened. The embodiment of FIG. 2 is designed to function with a numerical aperture of 0.45 at a 4:1 reduction ratio with a light source centered at 193 nm±1 nm, and has an image field of 20×5 mm.

From the long conjugate end, i.e., beginning at the object or reticle plane 31 the optical system of FIG. 2 comprises a folding mirror 32 which redirects light or radiation entering the system, thereby allowing the object and image planes to be parallel. Folding mirror 32 is succeeded by a first lens group comprising positive lens 33, negative lens 34, and positive lens 35, thin parallel plane beamsplitter 36, a second lens group comprising only negative lens 37, concave spherical mirror 38, a third lens group comprising positive lens 39, shell 40, positive lens 41, shell 42 and positive lens 43. This last group among other functions provides telecentricity at the image or wafer plane 44.

The first lens 33 of the first lens group collimates the rays entering beamsplitter 36 which would otherwise cause some aberrations.

As in the first embodiment, the field curvature and astigmatism of the spherical mirror 38 is balanced against the total power of the refracting elements. Mirror 38 is again operating at a reduction ratio other than 1:1. It therefore introduces spherical aberration and coma—these are corrected predominately by lens 37. Distortion is corrected primarily by the optimum choice of power and location between the first and third groups.

The airspaces in the third group (lenses 39-43) allow finite clearance between the last optical surface ad the image plane. In addition, they provide higher order coma and distortion correction that again is required by the reduction ration being other than 1:1.

The predominant low order astigmatism correction comes from the power of the third group. In contrast to the first embodiment, high order astigmatism correction is included in the third group—this is why the group has one more element than the fourth group of the first embodiment.

Residual axial color (chromatic difference of focus) is again balanced against chromatic variation of field curvature, which limits the spectral bandwidth of the system to the range 192-194 nanometers. This spectral range is less than the first embodiment as the dispersion of fused silica increases rapidly at shorter wavelengths. It remains adequate for an Excimer laser source, but does not allow the use of a filtered Mercury Arc.

The construction data of the embodiment of FIG. 2 is given in unfolded form in TABLE II.

TABLE II

| No. | Radius | Sepn | Clr. Diam. | Material |
|---|---|---|---|---|
| 1 | 804.136 | | 201.81 | |
| 2 | −638.535 | 21.000 | 202.02 | FQTZ |
| 3 | 496.223 | 124.640 | 183.79 | Air |
| 4 | 278.033 | 12.150 | 179.74 | FQTZ |
| 5 | 343.433 | 32.336 | 180.91 | Air |
| 6 | 803.775 | 18.375 | 179.00 | FQTZ |
| 7 | Plane | 88.767 | 167.34 | Air |
| 8 | Plane | 18.103 | 165.73 | FQTZ |
| 9 | −230.406 | 79.655 | 156.55 | Air |
| 10 | −478.496 | 13.125 | 159.96 | FQTZ |
| 11 | −372.778 | 5.793 | 160.25 | Air |
| 12 | −478.496 | 5.793 | 157.26 | Air |
| 13 | −230.406 | −13.125 | 145.40 | FQTZ |
| 14 | Plane | −60.000 | 114.83 | Air |
| 15 | Plane | −19.655 | 102.37 | Air |
| 16 | 116.134 | 73.470 | 80.78 | Air |
| 17 | 180.260 | 12.250 | 76.88 | FQTZ |
| 18 | 60.419 | 1.000 | 73.03 | Air |
| 19 | 54.437 | 11.572 | 65.15 | FQTZ |
| 20 | 90.217 | 6.851 | 64.30 | Air |
| 21 | 2476.180 | 26.052 | 53.20 | FQTZ |
| 22 | −129.689 | 4.559 | 51.57 | Air |
| 23 | −128.971 | 15.231 | 45.83 | FQTZ |
| 24 | 249.518 | 1.448 | 42.10 | Air |
| 25 | −1730.382 | 15.570 | 33.52 | FQTZ |
| 26 | Plane | 12.500 | 21.00 | Air |

The chief difference between the two optical reduction systems above discussed is that one was designed to function at 248 nm and the other at 193 nm. It should be understood that the optical systems could be modified to function at other wavelengths. Both optical systems are unusually compact, e.g., the optical system of FIG. 1 has a length less than 0.5 meter. By making the object fields smaller the systems can be made more compact.

These and other modifications are possible in light of the above description which should not be deemed as placing restrictions on the present invention other than those set fourth in the Claims which follow.

What is claimed is:

1. A catadioptric optical reduction system comprising from the long conjugate end to the short conjugate end:
   a first lens group;
   a beamsplitter;
   a second lens group;
   a reduction mirror;
   a third lens group;
   arranged such that radiation entering said system passes through said first lens group, said beamsplitter, said second lens group and is reflected by said reflector back through said second lens group and is reflected by said beamsplitter through said third lens group.

2. An optical system according to claim 1 wherein:
said first lens group corrects for lateral color and distortion correction by balancing its power against the power of the third lens group.

3. An optical system according to claim 1 wherein said first, second, and third lens groups together correct for aberrations introduced into the system by the mirror.

4. An optical system according to claim 2 wherein said first, second, and third lens groups together correct for aberrations introduced into the system by the mirror.

5. An optical system according to claim 4 wherein:
said second lens group corrects low order coma and spherical aberrations.

6. An optical system according to claim 5 wherein:
said third lens group corrects for high order coma and higher orders of distortion.

7. An optical system according to claim 6 wherein:
said third lens group predominately corrects for astigmatism.

8. An optical system according to claim 7 wherein:
said first, second, and third lens groups and said beamsplitter are composed of the same material.

9. An optical system according to claim 8 wherein:
said material is fused silica.

10. An optical system according to claim 9 wherein:
said beamsplitter is a cube.

11. An optical system according to claim 9 wherein:
said beamsplitter is a tilted thin parallel plate.

12. An optical system according to claim 11 wherein said first lens group includes means for collimating radiation before it enters said beamsplitter.

13. An optical system according to claim 10 further including a lens group disposed before said first lens group providing telecentricity at said long conjugate end.

14. An optical system according to claim 12 wherein:
said third lens group provides telecentricity at said short conjugate end.

15. An optical system according to claim 13 wherein:
said third lens group provides telecentricity at said short conjugate end.

* * * * *